United States Patent [19]
Schemmel

[11] Patent Number: 5,053,723
[45] Date of Patent: Oct. 1, 1991

[54] PHASE-LOCKED LOOP WITH PULSE-DURATION MODULATION FINE FREQUENCY CONTROL

[75] Inventor: Hans-Robert Schemmel, Nuremberg, Fed. Rep. of Germany

[73] Assignee: U.S. Philips Corp., New York, N.Y.

[21] Appl. No.: 541,000

[22] Filed: Jun. 20, 1990

[30] Foreign Application Priority Data

Jun. 20, 1989 [DE] Fed. Rep. of Germany ....... 3920008

[51] Int. Cl.$^5$ ......................... H03L 7/099; H03L 7/18
[52] U.S. Cl. ........................................ 331/14; 331/16; 331/17; 331/25; 331/36 C; 331/116 R; 331/179
[58] Field of Search ...................... 331/1 A, 14, 16, 17, 331/25, 36 C, 36 L, 116 R, 179

[56] References Cited
U.S. PATENT DOCUMENTS 4,503,401  3/1985  Kyriakos et al. ............. 331/36 C X

FOREIGN PATENT DOCUMENTS 3324919  1/1985  Fed. Rep. of Germany ........ 331/17
2120478  11/1983  United Kingdom .................. 331/10

Primary Examiner—Siegfried H. Grimm
Attorney, Agent, or Firm—Steven R. Biren

[57] ABSTRACT

A phase-locked loop includes an oscillator controlled by means of a switching network and a microprocessor which generates, in response to the output of a phase detector, two groups of output signals. A first group (Q1 ... QN) is for adjusting the frequency of the oscillator in steps by selectively switching in frequency determining elements, and a second group (P1 ... PM) for feeding a pulse duration modulator. The pulse duration modulator produces a control signal for a frequency determining minimum element of the switching network. The control signal has a duty cycle indicative of the frequency determination contribution by the minimum element.

9 Claims, 1 Drawing Sheet

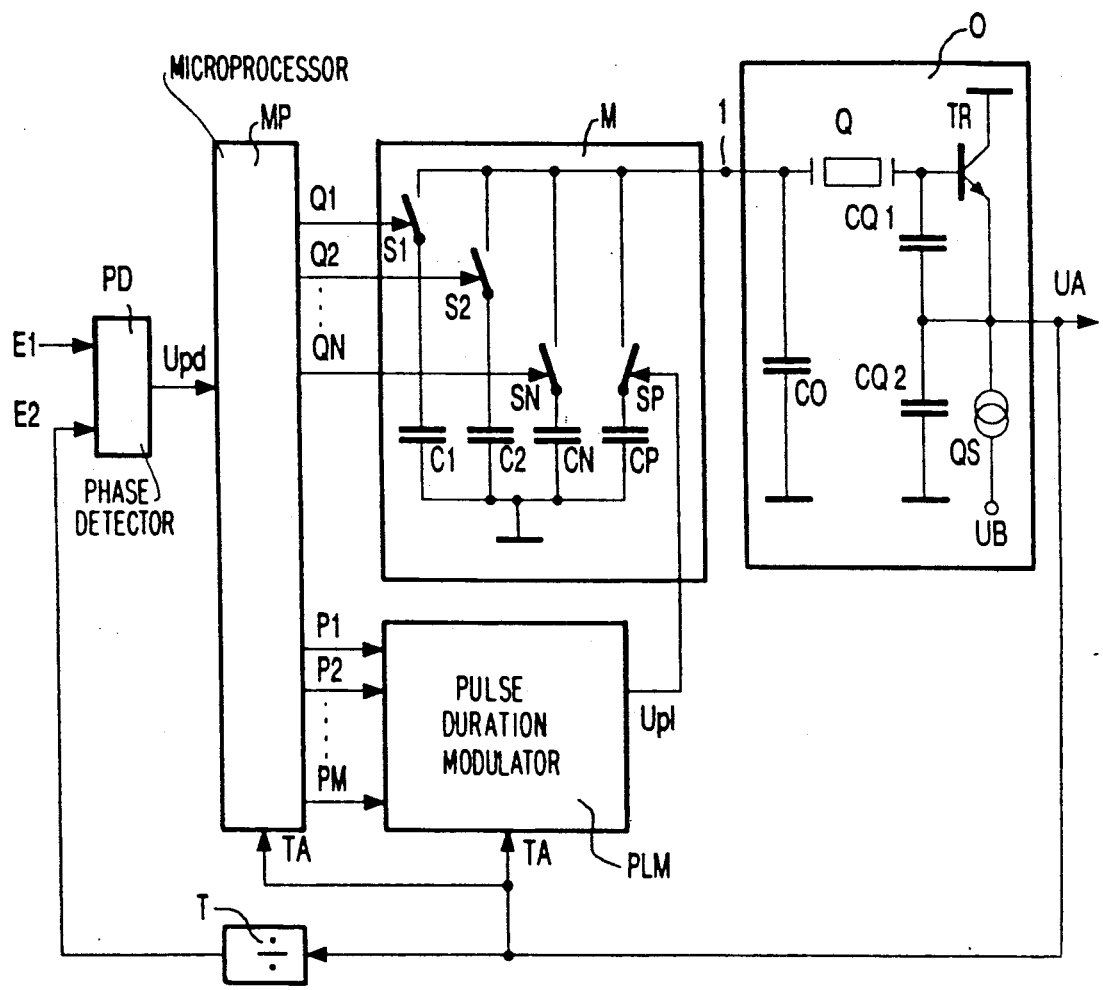

PHASE-LOCKED LOOP WITH PULSE-DURATION MODULATION FINE FREQUENCY CONTROL

BACKGROUND OF THE INVENTION

1. Field of the Invention

The invention relates to a phase-locked loop comprising a phase detector and an oscillator controlled by means of a switching network.

2. Description of the Related Art

Phase-locked loops of this type are necessary, for example, for clock supply arrangements in digital data and transmission networks. The phase-locked loop in essence comprises a voltage-controlled oscillator, a loop filter and a phase detector which compares the phase position of a signal produced by the voltage-controlled oscillator to the phase position of an input signal. The control voltage produced by the phase detector readjusts the oscillator via the loop filter until the phase difference is minimized or has reached a preset nominal value.

In German Offenlegungsschrift DE-A 33 24 919 a phase-locked loop is disclosed comprising a voltage-controlled oscillator, whose output is connected to a first input of a phase detector. At the second input of the phase detector a signal having a reference frequency is available. Between the phase detector and the voltage-controlled oscillator a counter is inserted as well as a switching network comprising switching elements, which is for example arranged as a capacitance network and then comprises as switching elements capacitors having different capacitances. The frequency of the voltage-controlled oscillator can be adjusted in steps via the switching network by shunting various capacitors. Consequently, the accuracy with which this frequency can be adjusted is restricted by the capacitance tolerances of the capacitors in the switching network, specifically if the reference frequency drops out. Another voltage-controlled oscillator using a switchable capacitor network for frequency control is shown in UK Patent Application No. GB 2 120 478A.

SUMMARY OF THE INVENTION

It is an object of the invention to provide a phase-locked loop of the type mentioned above, in which the frequency of the voltage-controlled quartz oscillator can simply and cost-effectively be adjusted beyond the accuracy restricted by the tolerance of the switching network.

This object is achieved in a phase-locked loop of the type mentioned in the opening paragraph, in that at least one switching element of the switching network is driven by a pulse duration modulator. A feature of the invention is that a group of output signals formed by a processor is applied to the switching element of the switching network for adjustment of frequency in steps and a further group of output signals from the processor is applied to the pulse duration modulator which drives the at least one switching element. Further objects, features and advantages will become apparent from the following detailed description and claims.

BRIEF DESCRIPTION OF THE DRAWING

The invention will now be further explained with reference to the drawing, wherein:

The sole FIGURE shows an exemplary embodiment of a phase-locked loop.

DETAILED DESCRIPTION OF THE PREFERRED EMBODIMENTS

The phase-locked loop represented in the drawing FIGURE comprises a phase detector PD to which are applied an external signal E1 as a guide signal and a signal E2 derived from a voltage-controlled oscillator as a reference signal. The signal E1 is, for example, a clock signal derived from a received digital signal. The phase detector PD compares the phase position of the frequencies of the signals E1, E2 and produces a signal Upd which depends on the phase shift. The signal Upd is applied to a microprocessor MP which produces a first group of output signals Q1 . . . QN and a second group of output signals P1 . . . PM. The microprocessor assumes specifically filter and control functions and is timed with a clock TA of an output signal UA produced by a voltage-controlled oscillator O. The first group of output signals Q1 . . . QN of the microprocessor MP is fed to a switching network M arranged as a capacitance network. The switching network M is then formed by a capacitance network comprising capacitors C1 . . . CN, CP while a connection point of the capacitors C1 . . . CN, CP is always connected to a reference potential (ground) and the other connection point can be switched to a terminal 1 by means of switches S1 . . . SN, SP. In a further embodiment the switching network M is arranged as an inductance network. The switches S1 . . . SN of the switching network M are controlled by the respective signals Q1 . . . QN. Thus between the terminal 1 and the reference potential a voltage occurs that can be adjusted by shunting the capacitors C1 . . . CN, CP. The terminal 1 is connected to the voltage-controlled oscillator O. In the oscillator O a capacitor CO is inserted between the terminal 1 and the reference potential. The first connection point of a quartz crystal Q is connected to the terminal 1, the second connection point to the base of a transistor T, whose collector is connected to the reference potential. A capacitor CQ1 is shunted to the base-emitter path of the transistor T and between a capaciitor CQ2 is inserted between the emitter and the reference potential. The emitter of the transistor T is connected to a supply of voltage UB via a current source QS. The signal UA occurring on the emitter of the transistor T at a clock rate TA is applied to a clock divider T, which forms the signal E2 applied to the phase detector PD. In a further embodiment a transformer and/or reactance is inserted between the terminal 1 of the switching network M and the quartz crystal Q. In this manner the reactance of the switching network M is adjusted to the oscillator O.

The second group of output signals P . . . PM of the microprocessor MP is applied to pulse duration modulator PLM which is timed with a clock TA and forms from the signals a signal Upl. The switch SP, by means of which the grounded capacitor CP can be shunted to the capacitors C1 . . . CN of the switching network, is controlled by the signal Upl. The pulse duration modulator PLM, in the exemplary embodiment as shown in the FIGURE, is also timed with the clock TA. In a preferred embodiment the capacitor CP driven by the pulse duration modulator PLM is the minimum-value switching element of the switching network M.

In a practical embodiment of the phase lock loop the phase detector PD produces from the guide signal E1 and the reference signal E2 with a frequency of 16 kHz the signal UPD having a 8-bit wordlength. The microprocessor MP operates in accordance with the behavior of a loop filter and in the practical embodiment of the phase-locked loop is clocked at 6.144 MHz. The first group of output signals Q1 ... QN (5 bits) controls the switches S1 ... SN of the switching network M which is arranged as a capacitance network in the practical embodiment of the phase-locked loop. By means of the capacitors C1 ... CN, CP which can be shunted to each other at the terminal 1 at the input of the voltage-controlled oscillator O, the voltage available at terminal 1 and ground is produced as a control voltage of the voltage-controlled oscillator O and thus the frequency of the oscillator can be adjusted in steps. The overall capacitance of the switching network then essentially results from the sum of the capacitances of the shunted capacitors C1 ... CN. Since the capacitances of the capacitors C1... CN have specific tolerances of, for example 1%, the accuracy of the frequency of the voltage available at terminal 1 and ground is restricted. This inaccuracy is eliminated by the second group of output signals P1 ... PM of the microprocessor M. For this purpose the second group of output signals P1 ... PM (8 bits) is applied to the pulse duration modulator PLM, which is also timed with the 6.144 MHz clock TA. The output signal Upl of the pulse duration modulator PLM controls the switch SP and thus shunts the capacitor CP to the capacitors C1 ... CN with a 24 kHz clock. The capacitance obtained by means of pulse duration modulation at switch SP is equal to the product of the duty cycle of the pulse duration modulator and the capacitance of the capacitor CP. The overall capacitance formed by the switching network M and the pulse duration modulator PLM thus appears from the sum of the overall capacitance of the switching network M and the product of the duty cycle of the pulse duration modulator and the capacitance of the capacitor CP. Thus, because the capaciitor CP driven by pulse duration modulator PLM is connected in parallel with the capacitors C1 ... CN, the voltage between the terminal 1 and ground can be adjusted accurately and thus the frequency of the voltage-controlled oscillator can be adjusted even beyond the accuracy level as restricted by the tolerances of the capacitors C1 ... CN of the switching network M. In the practical embodiment of the phase-locked loop, the output signal UA having the clock rate TA of 6.144 MHz is available at the output of the quartz oscillator O, which output signal provides the clock for the microprocessor MP and the pulse duration modulator PLM. The signal UA is applied to the phase detector PD as a reference signal E2 via a clock divider T which performs a frequency division by the factor 384 in the practical embodiment of the phase-locked loop.

I claim:

1. A phase-locked loop comprising a phase detector having an input terminal and a voltage-controlled oscillator controlled by means of a switching network, characterized in that at least one switching element (CP) of the switching network (M) is driven by a pulse duration modulator (PLM), and in that signals derived from output of said phase detector are coupled to said switching network and said pulse duration modulator.

2. A phase-locked loop are claimed in Claim 1, characterized in that a first group of output signals (Q1 ... QN) formed by a microprocessor having its input coupled to the output of said phase detector is applied to switching elements (C1 ... CN) of the switching network (M) and at least a further group of output signals (P1 ... PM) is applied to the pulse duration modulator (PLM), which drives a minimum-value switching element (CP).

3. A phase-locked loop as claimed in claim 1 characterized in that the pulse duration modulator (PLM) is timed with a clock (TA) derived from an output signal (UA) of said voltage-controlled oscillator (O).

4. A phase-locked loop as claimed in claim 1 characterized in that the switching network (M) is arranged as a capacitance network.

5. A phase-locked loop as claimed in claim 3 characterized in that a switch (SP) controlled as a function of the clock (TA) is provided for activating the switching element (CP).

6. A phase-locked loop as claimed in claim 2, characterized in that in response to an external input signal on its input terminal and an internal input signal derived from the clock on a second input terminal of said phase detector, the phase detector (PD) produces an output signal (Upd) to be applied to the microprocessor (MP).

7. A phase-locked loop as claimed in claim 2 characterized in that the microprocessor (MP) and the pulse duration modulator (PLM) have a common clock (TA).

8. A phase-locked loop as claimed in claim 6 characterized in that the output signal (UA) of said voltage-controlled oscillator is applied to the phase detector (PD) via a clock divider (T).

9. A phase-locked loop as claimed in claim 3, characterized in that a capacitor is connected in parallel with an input of the voltage-controlled oscillator (O).

* * * * *